United States Patent
Tangredi et al.

(10) Patent No.: US 12,189,016 B2
(45) Date of Patent: Jan. 7, 2025

(54) METHOD FOR TESTING A SENSOR, AND ELECTRONIC CIRCUIT

(71) Applicant: Robert Bosch GmbH, Stuttgart (DE)

(72) Inventors: Domenico Tangredi, Milan (IT); Gabriele Cazzaniga, Rosate MI (IT); Gabriele Pozzato, Palo Alto, CA (US); Manuel Salvatore Santoro, Milan (IT); Massimiliano Musazzi, Como (IT)

(73) Assignee: ROBERT BOSCH GMBH, Stuttgart (DE)

( * ) Notice: Subject to any disclaimer, the term of this patent is extended or adjusted under 35 U.S.C. 154(b) by 106 days.

(21) Appl. No.: 18/007,086

(22) PCT Filed: Sep. 16, 2021

(86) PCT No.: PCT/EP2021/075405
§ 371 (c)(1),
(2) Date: Jan. 27, 2023

(87) PCT Pub. No.: WO2022/069233
PCT Pub. Date: Apr. 7, 2022

(65) Prior Publication Data
US 2023/0266420 A1   Aug. 24, 2023

(30) Foreign Application Priority Data
Sep. 30, 2020  (DE) ................. 10 2020 212 329.2

(51) Int. Cl.
*G01R 35/00*  (2006.01)
*G01R 27/26*  (2006.01)

(52) U.S. Cl.
CPC ....... *G01R 35/007* (2013.01); *G01R 27/2605* (2013.01)

(58) Field of Classification Search
CPC .............. G01R 35/007; G01R 27/2605; G01D 2218/10; G01D 21/00
(Continued)

(56) References Cited

U.S. PATENT DOCUMENTS 11,585,829 B2 *  2/2023  Yanagisawa ............ G01P 21/00
2010/0180687 A1   7/2010  Hammerschmidt
(Continued)

FOREIGN PATENT DOCUMENTS

CH         708761 A2    4/2015
DE   102013206646 A1   10/2014
(Continued)

OTHER PUBLICATIONS

International Search Report for PCT/EP2021/075405, Issued Jan. 5, 2021.

*Primary Examiner* — Giovanni Astacio-Oquendo
(74) *Attorney, Agent, or Firm* — NORTON ROSE FULBRIGHT US LLP; Gerard A. Messina

(57) ABSTRACT

A method for testing a sensor within an electronic circuit. The sensor includes a first sensor element and a first reference element in a first branch, and a second sensor element and a second reference element in a second branch of the Wheatstone bridge circuit, which is in parallel with the first branch. The Wheatstone bridge circuit includes first and second inputs for first and second reference signals, respectively, which are each connected to the branches. The first branch includes a first signal output, and the second branch includes a second signal output between the second sensor element and the second reference element. The method includes: opening the first or second switch; applying a predefined first and/or second reference signal(s); and evalu-
(Continued)

ating a first or second useful signal as to whether damage to the sensor or an electrical connection between the sensor and the electronic circuit exists.

8 Claims, 2 Drawing Sheets

(58) Field of Classification Search
USPC .......................................... 324/606, 601, 600
See application file for complete search history.

(56) References Cited

U.S. PATENT DOCUMENTS

| | | | |
|---|---|---|---|
| 2015/0185279 A1 | 7/2015 | Milano et al. | |
| 2015/0276853 A1* | 10/2015 | Murashima | G01R 31/28 307/73 |
| 2020/0110116 A1* | 4/2020 | Czardybon | G01R 31/2829 |

FOREIGN PATENT DOCUMENTS

| | | |
|---|---|---|
| JP | 2015021790 A | 2/2015 |
| WO | 9901777 A1 | 1/1999 |

* cited by examiner

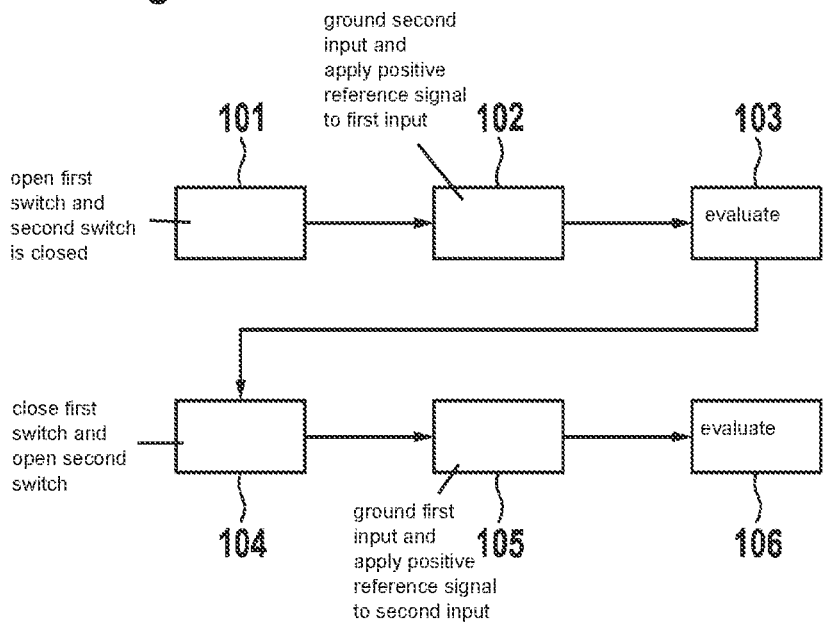
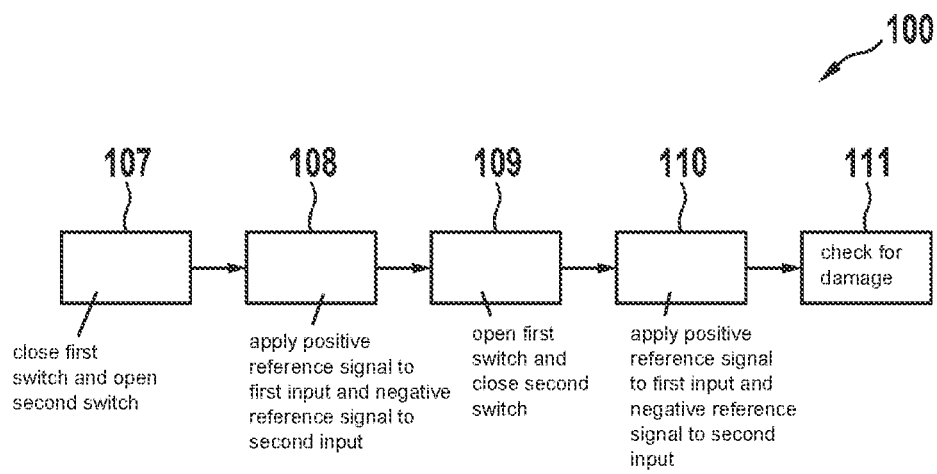

METHOD FOR TESTING A SENSOR, AND ELECTRONIC CIRCUIT

FIELD

The present invention relates to a method for testing a sensor and to an electronic circuit. The method is, in particular, suitable for enabling a self-test of the sensor and of an associated electronic circuit.

BACKGROUND INFORMATION

Capacitive sensors are available in which two measuring capacitors and two reference capacitors are evaluated with the aid of a Wheatstone bridge circuit. This basic design is described in U.S. Patent Application Publication No. US 2010/0 180 687 A1, for example. The capacitors to be evaluated could be situated within micromechanical structures, for example MEMS structures, and, in particular, be configured for measuring pressure, acceleration and/or a rotation rate. If the sensors and/or electronic circuits used for the evaluation are defective, for example due to damage after a certain run time, the measuring results are incorrect. With the conventional sensors, however, this cannot be identified during operation of the sensor.

An error detection in the case of a Wheatstone bridge circuit of a sensor is described in Japan Patent Application No. JP 2015-021 790 A and Germany Patent Application No. DE 10 2013 206 646 A1.

SUMMARY

It is an object of the present invention to provide a method for testing a sensor, with the aid of which errors of the sensor or of the electronic circuit may be identified. It is furthermore an object of the present invention to provide a corresponding electronic circuit.

These objects may be achieved by the present invention. Advantageous refinements and example embodiments of the present invention are disclosed herein.

A method according to the present invention is used for testing a sensor within an electronic circuit. According to an example embodiment of the present invention, the sensor includes a first sensor element and a first reference element in a first branch of a Wheatstone bridge circuit, and a second sensor element and a second reference element in a second branch of the Wheatstone bridge circuit, the first branch and the second branch being in parallel with one another. The Wheatstone bridge circuit includes a first input for a first reference signal and a second input for a second reference signal, the first input and the second input each being connected to the first branch and the second branch. The first reference signal and the second reference signal are provided with the aid of a control logic, the control logic being part of the electronic circuit. The first branch includes a first signal output between the first sensor element and the first reference element. The second branch includes a second signal output between the second sensor element and the second reference element. A first useful signal may be determined at the first signal output, and a second useful signal may be determined at the second signal output. The first signal output is connected via a first switch to a first amplifier input of an amplifier. The amplifier may be designed as a low-noise charge-to-voltage converter. In particular, a low-noise charge-to-voltage converter is an amplifier. The second signal output is connected via a second switch to a second amplifier input of the amplifier. The amplifier is part of the electronic circuit.

According to an example embodiment of the present invention, tor the identification of an error, the first switch is closed, and the second switch is opened. Thereafter, a positive reference signal is applied to the first input, and a negative reference signal is applied to the second input, and the first useful signal is recorded. Thereafter, the first switch is opened, and the second switch is closed. Thereafter, a positive reference signal is applied to the first input, and a negative reference signal is applied to the second input, and the second useful signal is recorded. A damage to the sensor exists when the first useful signal and the second useful signal have differing absolute values, in particular, when the first useful signal and the second useful signal differ by a value outside a predefined tolerance.

In particular, it may be provided that, when the first switch is open, the second useful signal is evaluated, and when the second switch is open, the first useful signal is evaluated.

According to an example embodiment of the present invention, it may be provided that the first sensor element and the second sensor element encompass variable capacitors, for example of a micromechanical structure, and that the first reference element and the second reference element include invariable capacitors. In particular, it may be provided that a variable to be measured, for example pressure, acceleration or a rotation rate, acts on a micromechanical structure, and deflects the micromechanical structure in the process. Capacitors integrated into the micromechanical structure change in the process, and represent the first sensor element and the second sensor element.

The first reference element is situated between the second input and the first signal output. The second reference element is situated between the first input and the second signal output. The second sensor element is situated between the second input and the second signal output.

In one specific example embodiment of the present invention, the first switch is opened, and the second switch is closed, thereafter the second input is grounded, and a positive reference signal is applied to the first input. The second useful signal then includes a piece of information about the second reference element, the piece of information about the second reference element being evaluated with respect to the damage of the electrical connection between the sensor and the electronic circuit.

In one specific example embodiment of the present invention, thereafter the first switch is closed, and the second switch is opened. Furthermore, thereafter the first input is grounded, and a positive reference signal is applied to the second input. The first useful signal then includes a piece of information about the first reference element, the piece of information about the first reference element being evaluated with respect to the damage of the electrical connection between the sensor and the electronic circuit.

In one specific example embodiment of the present invention, the first useful signal is evaluated with respect to its absolute value. In one specific embodiment, the second useful signal is evaluated with respect to its absolute value.

The present invention furthermore encompasses a computer program encompassing commands, which, during the execution of the computer program by a computer, prompt the computer to carry out one of the methods according to the present invention.

The present invention furthermore encompasses a machine-readable memory medium on which the computer program according to the present invention is stored.

The present invention furthermore encompasses an electronic circuit including a control logic, a sensor, and an amplifier. According to an example embodiment of the present invention, the sensor includes a first sensor element and a first reference element in a first branch of a Wheatstone bridge circuit, and a second sensor element and a second reference element in a second branch of the Wheatstone bridge circuit. The first branch and the second branch are parallel to one another. The Wheatstone bridge circuit includes a first input for a first reference signal and a second input for a second reference signal, the first input and the second input each being connected to the first branch and the second branch. The first reference signal and the second reference signal are provided with the aid of the control logic. The first branch includes a first signal output between the first sensor element and the first reference element, and the second branch includes a second signal output between the second sensor element and the second reference element. A first useful signal may be determined at the first signal output, and a second useful signal may be determined at the second signal output, the first signal output being connected via a first switch to a first amplifier input of the amplifier, and the second signal output being connected via a second switch to a second amplifier input of the amplifier. With the aid of the control logic, the electronic circuit is configured to apply the first reference signal to the first input, and the second reference signal to the second input, to open and to close the first switch and the second switch, and to evaluate the first and/or second useful signal(s), and to carry out the method according to the present invention in the process.

Exemplary embodiments of the present invention are described based on the figures.

BRIEF DESCRIPTION OF THE DRAWINGS

FIG. 3 shows a second flowchart, according to an example embodiment of the present invention.

FIG. 4 shows a third flowchart, according to an example embodiment of the present invention.

DETAILED DESCRIPTION OF EXAMPLE EMBODIMENTS

Figure 1:
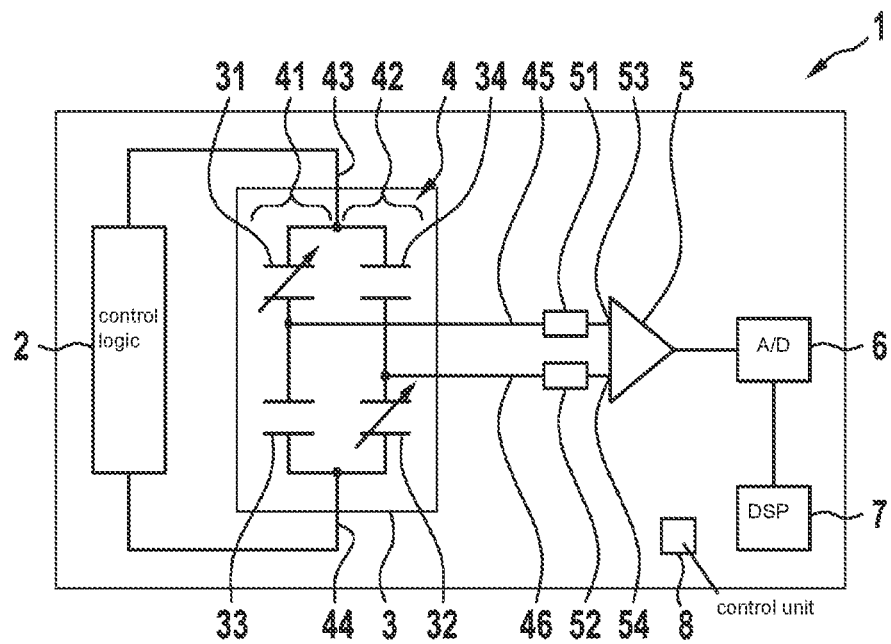
FIG. 1 shows an electronic circuit, according to an example embodiment of the present invention.

FIG. 1 shows an electronic circuit 1 including a control logic 2, a sensor 3, and an amplifier 5. Sensor 3 includes a first sensor element 31 and a first reference element 33 in a first branch 41 of a Wheatstone bridge circuit 4, and a second sensor element 32 and a second reference element 34 in a second branch 42 of Wheatstone bridge circuit 4. First branch 41 and second branch 42 are parallel to one another. Wheatstone bridge circuit 4 includes a first input 43 for a first reference signal and a second input 44 for a second reference signal, first input 43 and second input 44 each being connected to first branch 41 and second branch 42. The first reference signal and the second reference signal are provided with the aid of control logic 2. For this purpose, control logic 2 is connected to first input 43 and second input 44. First branch 41 includes a first signal output 45 between first sensor element 31 and first reference element 33. Second branch 42 includes a second signal output 46 between second sensor element 32 and second reference element 34. A first useful signal may be determined at first signal output 45, and a second useful signal may be deter-mined at second signal output 46. First signal output 45 is connected via a first switch 51 to a first amplifier input 53 of amplifier 5.

Second signal output 46 is connected via a second switch 52 to a second amplifier input 54 of amplifier 5. With the aid of control logic 2, electronic circuit 1 is configured to apply the first reference signal to first input 43, and the second reference signal to second input 44, to open and to close first switch 51 and second switch 52, and to evaluate the first and/or second useful signal(s).

It may be provided that first sensor element 31 and second sensor element 32 encompass variable capacitors, for example of a micromechanical structure, and that first reference element 33 and second reference element 34 include invariable capacitors. In particular, it may be provided that a variable to be measured, for example pressure, acceleration or a rotation rate, acts on a micromechanical structure, and deflects the micromechanical structure in the process. Capacitors integrated into the micromechanical structure change in the process, and represent first sensor element 31 and second sensor element 32.

In one exemplary embodiment, as illustrated in FIG. 1, first sensor element 31 is situated between first input 43 and first signal output 45, first reference element 33 is situated between second input 44 and first signal output 45, second reference element 34 is situated between first input 43 and second signal output 46, and second sensor element 32 is situated between second input 44 and second signal output 46.

Also shown in FIG. 1 are an optional A/D converter 6, with the aid of which analog signals may be converted into digital signals, and an optional digital signal processor 7, which is used for further processing the digital signals. A/D converter 6 and digital signal processor 7 are also part of electronic circuit 1. Furthermore, an optional control unit 8 is shown, with the aid of which control logic 2 can be controlled, and with the aid of which the useful signals may be evaluated.

Figure 2:
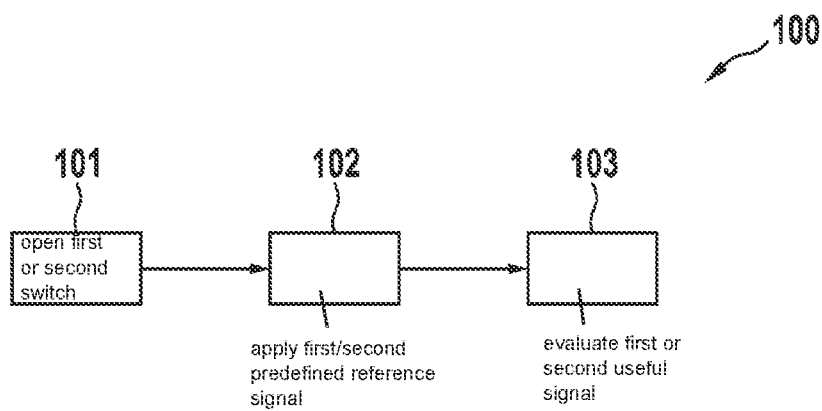
FIG. 2 shows a first flowchart, according to an example embodiment of the present invention.

FIG. 2 shows a first flowchart 100 of a method which may, for example, be carried out with the aid of control unit 8 of electronic circuit 1 of FIG. 1. The method includes the following steps:

opening first switch 51 or second switch 52 in a first method step 101;

applying a predefined first reference signal and/or a second predefined reference signal in a second method step 102; and evaluating the first useful signal or the second useful signal as to whether damage to sensor 3 or an electrical connection between sensor 3 and electronic circuit 1 exists in a third method step 103.

In one exemplary embodiment, first switch 51 is opened and second switch 52 is closed in first method step 101. Thereafter, in second method step 102, second input 44 is grounded, and a positive reference signal is applied to first input 43. The positive reference signal may be a square wave signal. The second useful signal then includes a piece of information about second reference element 34. The piece of information about second reference element 34 is evaluated in third method step 103 with respect to the damage of the electrical connection between sensor 3 and electronic circuit 1.

The evaluation may, in particular, take place in such a way that a value is predefined for second reference element 34, within a predefined measuring tolerance, is compared to a measured value, for example a nominal capacitance of second reference element 34 to a capacitance measured as the second useful signal.

In one specific embodiment, the first useful signal is evaluated with respect to its absolute value.

FIG. 3 shows a second flowchart 100 of a method which may, for example, be carried out with the aid of control unit 8 of electronic circuit 1 of FIG. 1. The method includes the method steps of FIG. 2, as described in the three previous paragraphs. Furthermore, first switch 51 is closed, and second switch 52 is opened, in a fourth method step 104. Thereafter, in a fifth method step 105, first input 43 is grounded, and a positive reference signal is applied to second input 44. The positive reference signal may be a square wave signal. The first useful signal then includes a piece of information about first reference element 33. The piece of information about first reference element 33 is evaluated in a sixth method step 106 with respect to the damage of the electrical connection between sensor 3 and electronic circuit 1.

The evaluation may, in particular, take place in such a way that a value is predefined for first reference element 33, within a predefined measuring tolerance, is compared to a measured value, for example a nominal capacitance of first reference element 33 to a capacitance measured as the first useful signal. Predefined tolerances may be taken into consideration in the process.

In one specific embodiment, the second useful signal is evaluated with respect to its absolute value. It may be provided that both the first useful signal and the second useful signal are evaluated with respect to the absolute value. For example, a damage of the connection between sensor 3 and the electronic circuit may be assumed when the absolute values of the useful signals differ, it being possible to be provided that the differences are outside a predefined measuring tolerance.

FIG. 4 shows a third flowchart 100 of a method which may, for example, be carried out with the aid of control unit 8 of electronic circuit 1 of FIG. 1. The third flowchart may be carried out after the methods described in connection with FIGS. 2 and 3, or may also be carried out individually. In a seventh method step 107, first switch 51 is closed, and second switch 52 is opened. Thereafter, in an eighth method step 108, a positive reference signal is applied to first input 43, and a negative reference signal is applied to second input 44. The positive reference signal may be a square wave signal. The negative reference signal may also be a square wave signal. In eighth method step 108, the first useful signal is furthermore recorded. In a subsequent ninth method step 109, first switch 51 is opened, and second switch 52 is closed. In a subsequent tenth method step 110, a positive reference signal is applied to first input 43, and a negative reference signal is applied to second input 44. The positive reference signal may be a square wave signal. The negative reference signal may also be a square wave signal. Furthermore, the second useful signal is recorded in tenth method step 110. In an eleventh method step 111, it is checked whether a damage to sensor 2 exists. This is the case when the first useful signal and the second useful signal have differing absolute values. Predefined tolerances may be taken into consideration in the process.

A computer program encompasses commands which, during the execution of the computer program by a computer, prompt the computer to carry out the above-described method. This computer program may be stored in a machine-readable memory medium. In particular, the computer program may be stored in control unit 8.

Although the present invention was described in detail by the preferred exemplary embodiments, the present invention is not restricted to the described examples, and other variations may be derived therefrom by those skilled in the art without departing from the scope of protection of the present invention.

What is claimed is:

1. A method for testing a sensor within an electronic circuit, the sensor including a first sensor element and a first reference element in a first branch of a Wheatstone bridge circuit, and a second sensor element and a second reference element in a second branch of the Wheatstone bridge circuit, the first branch and the second branch being in parallel with one another, the Wheatstone bridge circuit including a first input for a first reference signal and a second input for a second reference signal, each of the first input and the second input each being connected to the first branch and the second branch, the first reference signal and the second reference signal being provided using a control logic, the control logic being part of the electronic circuit, the first branch includes a first signal output between the first sensor element and the first reference element, and the second branch includes a second signal output between the second sensor element and the second reference element, it being possible to determine a first useful signal at the first signal output and a second useful signal at the second signal output, the first signal output being connected via a first switch to a first amplifier input of an amplifier, the second signal output being connected via a second switch to a second amplifier input of the amplifier, and the amplifier being part of the electronic circuit, the method comprising the following steps:

closing the first switch and opening the second switch, and thereafter: (i) applying a positive reference signal to the first input and a negative reference signal to the second input, and (ii) recording the first useful signal;

opening the first switch and closing the second switch, and thereafter: (i) applying a positive reference signal to the first input and a negative reference signal to the second input, and (ii) recording the second useful signal;

evaluating the first useful signal and the second useful signal as to whether damage to the sensor or an electrical connection between the sensor and the electronic circuit exists, wherein a damage to the sensor exists when the first useful signal and the second useful signal have a differing absolute value.

2. The method as recited in claim 1, wherein the first sensor element is situated between the first input and the first signal output, the first reference element is situated between the second input and the first signal output, the second reference element is situated between the first input and the second signal output, and the second sensor element is situated between the second input and the second signal output.

3. The method as recited in claim 1, further comprising:

opening the first switch and closing the second switch, and thereafter: (i) grounding the second input, and (ii) applying a positive reference signal to the first input, the second useful signal including a piece of information about the second reference element; and evaluating the piece of information about the second reference element with respect to damage of the electrical connection between the sensor and the electronic circuit.

4. The method as recited in claim 3, wherein the first useful signal is evaluated with respect to its absolute value.

5. The method as recited claim 3, further comprising:
closing the first switch and opening the second switch, and thereafter: (i) grounding the first input, and (ii) applying a positive reference signal to the second input, the first useful signal including a piece of information about the first reference element, and
evaluating the piece of information about the first reference element with respect to the damage of the electrical connection between the sensor and the electronic circuit.

6. The method as recited in claim 5, wherein the second useful signal is evaluated with respect to its absolute value.

7. A non-transitory machine-readable memory medium on which is stored a computer program for testing a sensor within an electronic circuit, the sensor including a first sensor element and a first reference element in a first branch of a Wheatstone bridge circuit, and a second sensor element and a second reference element in a second branch of the Wheatstone bridge circuit, the first branch and the second branch being in parallel with one another, the Wheatstone bridge circuit including a first input for a first reference signal and a second input for a second reference signal, each of the first input and the second input each being connected to the first branch and the second branch, the first reference signal and the second reference signal being provided using a control logic, the control logic being part of the electronic circuit, the first branch includes a first signal output between the first sensor element and the first reference element, and the second branch includes a second signal output between the second sensor element and the second reference element, it being possible to determine a first useful signal at the first signal output and a second useful signal at the second signal output, the first signal output being connected via a first switch to a first amplifier input of an amplifier, the second signal output being connected via a second switch to a second amplifier input of the amplifier, and the amplifier being part of the electronic circuit, the computer program, when executed by a computer, causing the computer to perform the following steps:
closing the first switch and opening the second switch, and thereafter: (i) applying a positive reference signal to the first input and a negative reference signal to the second input, and (ii) recording the first useful signal;
opening the first switch and closing the second switch, and thereafter: (i) applying a positive reference signal to the first input and a negative reference signal to the second input, and (ii) recording the second useful signal;
evaluating the first useful signal and the second useful signal as to whether damage to the sensor or an electrical connection between the sensor and the electronic circuit exists, wherein a damage to the sensor exists when the first useful signal and the second useful signal have a differing absolute value.

8. An electronic circuit, comprising:
a control logic;
a sensor;
and an amplifier;
wherein the sensor includes a first sensor element and a first reference element in a first branch of a Wheatstone bridge circuit, and a second sensor element and a second reference element in a second branch of the Wheatstone bridge circuit, the first branch and the second branch being in parallel with one another, the Wheatstone bridge circuit including a first input for a first reference signal and a second input for a second reference signal, each of the first input and the second input being connected to the first branch and the second branch, the first reference signal and the second reference signal being provided using the control logic, the first branch including a first signal output between the first sensor element and the first reference element, and the second branch including a second signal output between the second sensor element and the second reference element, it being possible to determine a first useful signal at the first signal output and a second useful signal at the second signal output, the first signal output being connected via a first switch to a first amplifier input of the amplifier, the second signal output being connected via a second switch to a second amplifier input of the amplifier, the control logic being configured to control the electronic circuit in such a way that the first switch is closed and the second switch is opened, thereafter: (i) a positive reference signal is applied to the first input and a negative reference signal is applied to the second input, and (ii) the first useful signal is recorded, and then, the first switch is opened and the second switch is closed, and thereafter, (i) a positive reference signal is applied to the first input and a negative reference signal is applied to the second input, and (ii) the second useful signal is recorded, wherein a damage to the sensor exists when the first useful signal and the second useful signal have a differing absolute value.

* * * * *